United States Patent [19]

Panousis

[11] Patent Number: 4,835,585

[45] Date of Patent: May 30, 1989

[54] TRENCH GATE STRUCTURES

[75] Inventor: Peter T. Panousis, Allentown, Pa.

[73] Assignee: American Telephone and Telegraph Company, AT&T Bell Laboratories, Murray Hill, N.J.

[21] Appl. No.: 674,855

[22] Filed: Nov. 26, 1984

[51] Int. Cl.$^4$ .............................................. H01L 29/78
[52] U.S. Cl. ................................ 357/23.4; 357/23.11; 357/55; 437/38; 437/203
[58] Field of Search ...... 148/1.5, DIG. 50, DIG. 168; 357/23.4, 23.8, 23.9, 23.12, 55, 23.11, 40

[56] References Cited

U.S. PATENT DOCUMENTS

| 4,324,038 | 4/1982 | Chang et al. ............... 357/23.9 X |
| 4,455,740 | 6/1984 | Iwai ........................................ 29/571 |
| 4,499,652 | 2/1985 | Shrivastava ........................... 29/571 |

FOREIGN PATENT DOCUMENTS

| 1202429 | 9/1970 | United Kingdom ............. 357/23.11 |
| 1390135 | 4/1975 | United Kingdom ............. 357/23.11 |

OTHER PUBLICATIONS

Rideout et al., "MOSFETs with Polysilicon Gates Self—Aligned to the Field Isolation and to the Source/-Drain Regions", International Electron Devices Meeting (Technical Digest), Wash, DC, USA, Dec. 6-18, 1976.

Primary Examiner—Olik Chaudhuri
Attorney, Agent, or Firm—John T. Rehberg

[57] ABSTRACT

The specification describes several forms of trench gate MOS transistors and methods for making them. The structure further includes a pair of sidewall guards on opposing sidewalls to prevent inversion of the sidewalls when the trench gate is turned on.

6 Claims, 8 Drawing Sheets

GROW FOX (X-X OR Y-Y)

CUT DEVICE
WINDOW
GROW PAD
OXIDE (X-X OR Y-Y)

DEPOSIT
NITRIDE (X-X OR Y-Y)

DEPOSIT
MASKING
LAYER

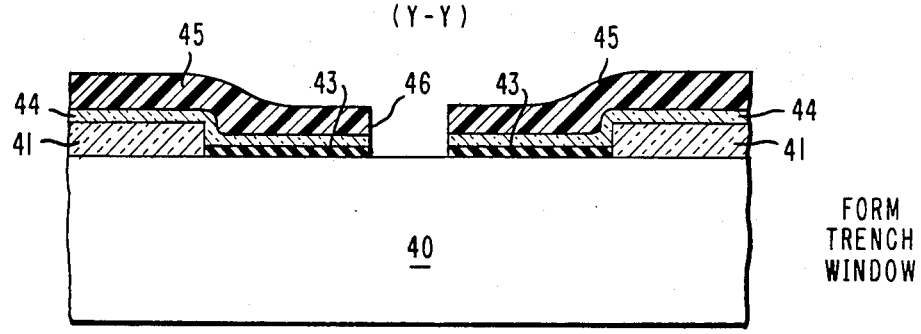
FIG. 4E (Y-Y)
FORM TRENCH WINDOW
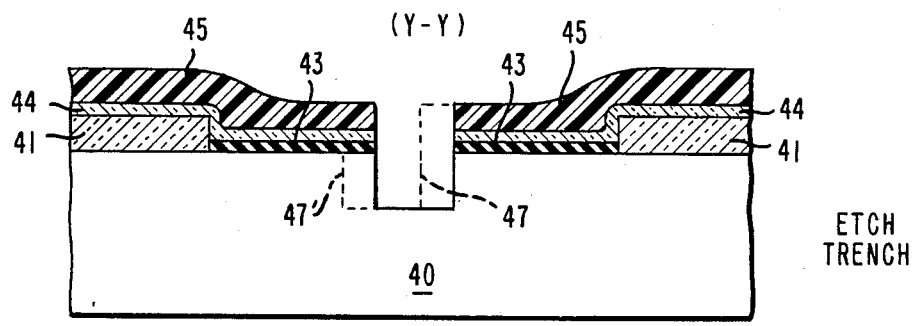
FIG. 4F (Y-Y)
ETCH TRENCH
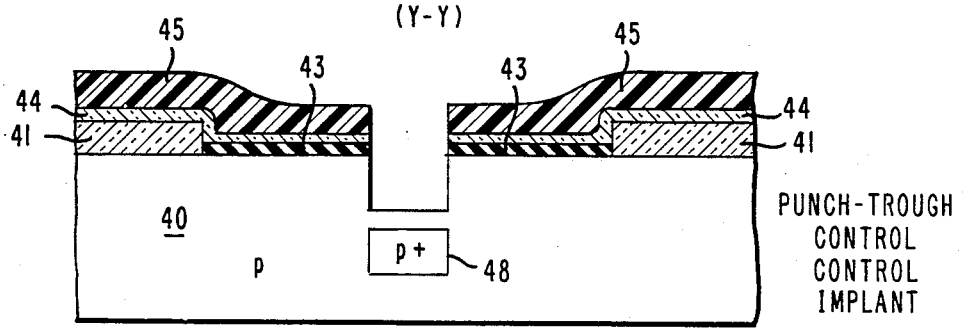
FIG. 4G (Y-Y)
PUNCH-TROUGH CONTROL CONTROL IMPLANT (X-X)

(X-X)

DEPOSIT FILLER LAYER (X-X)

GROW OXIDE (X-X)

DEPOSIT ETCH STOP

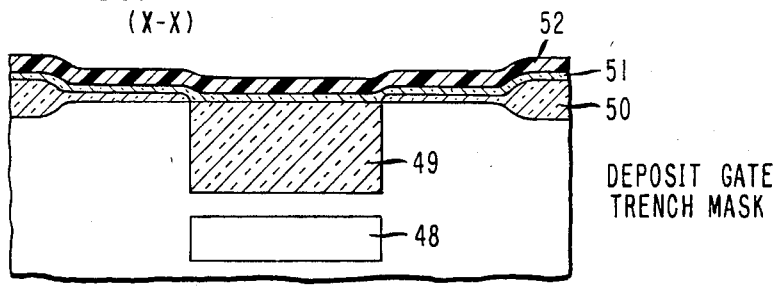
FIG. 4M (X-X)
DEPOSIT GATE TRENCH MASK
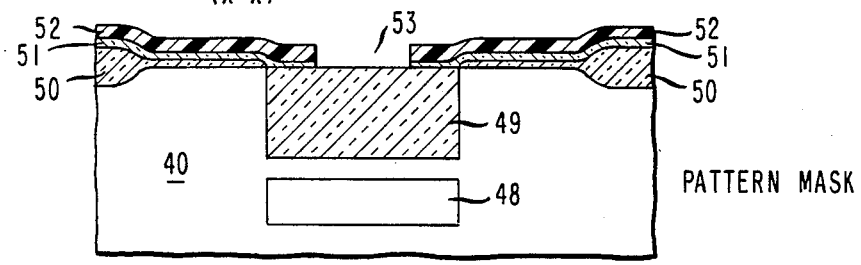
FIG. 4N (X-X)
PATTERN MASK
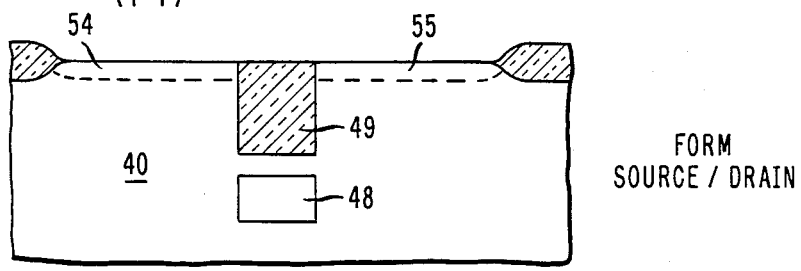
FIG. 4P (Y-Y)
FORM SOURCE/DRAIN
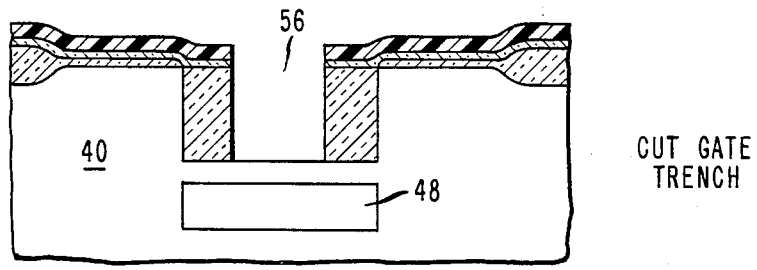
FIG. 4Q (X-X)
CUT GATE TRENCH (Y-Y)

GROW GATE
DIELECTRIC (Y-Y)

DEPOSIT
POLY-SILICON (Y-Y)

PLANARIZE
POLYSILICON

TRENCH GATE STRUCTURES

BACKGROUND OF THE INVENTION

Short channel effects in MOS transistors become increasingly prevalent as device sizes diminish. A consequence of shrinking channel lengths to accommodate denser device packing is "punchthrough", a condition wherein the depletion region from the biased drain region touches the depletion region of the source, resulting in a shorted transistor. Frequently, the punchthrough occurs at a substantial distance below the surface of the device.

One proposal for overcoming punchthrouh is described and claimed in U.S. Pat. No. 4,455,740, issued June 26, 1984 to Hiroshi Iwai. This patent describes a "trench" gate structure, in which the gate is recessed into the substrate surface. A substantial portion of the channel of the transistor appears to extend in a vertical direction. A consequence of the trench gate structure is supposed to be that the channel of the device can be maintained with a dimension long enough to avoid punchthrough but the surface dimension of the channel (i.e. the length of the channel that extends laterally along the substrate surface) is reduced substantially, thus reducing the chip area occupied by the channel. The trench can be made deep enough to form a barrier between the source and drain and prevent source drain punchthrough. However, the approach described by Iwai does not work unless the trench is made inordinately long to prevent the transistor from turning on at the surface. When the transistor turns on at the surface, the device is susceptible to punchthrough around the gate and the beneficial effects described by Iwai cannot be realized. The structures described herein can realize punchthrough immunity, and are operative and practical devices that have significant technological implications. For example, in practice situations will frequently arise wherein if the trench is made deep enough to prevent punchthrough the channel will be unacceptably long. The choice of design length for the channel varies within a relatively narrow margin since the length determines the operating speed of the transistor. Known approaches for overcoming punchthrough effects are to reduce the operating voltage, which results in smaller depletion regions, or to increase the impurity level of the substrate which has the same result. In either case the tendency for source-drain overlap is diminished. However, reducing the drain voltage level has other adverse consequences and increasing the substrate doping leads to increased subthreshold leakage.

Another method for eliminating punchthrough effects, which is not well known, is to place an impurity region selectively between the source-drain regions. That impurity region must lie deep within the substrate so as not to prevent normal operation through the channel of the device. While this approach should prove effective, it is difficult to make with very small dimensions, i.e. in VLSI technology. A major reason for that is that there is no stage in the conventional processing that affords a mask that is convenient or self-aligned to the region in which the implant is to be placed.

SUMMARY OF THE INVENTION

In the trench gate structure, the mask used to form the trench is self-aligned with respect to the region where an implant can be advantageously placed to control punchthrough. Recognizing that this combination of control measures is practically obtainable gives the device designer an added degree of freedom. If the gate length required to avoid punchthrough is too long from the standpoint of other design criteria, the trench can be made shallower and the punchthrough control implant added. While the trench mask is useful for this implant (an important advantage) the mask is not, precisely speaking, self-aligned, since it does not encompass the full extent of the channel. However, to be effective, the punchthrough control implant need only lie reliably within the channel. The fact that the punchthrough control implant is not coextensive with the total channel length is advantageous since it reduces the possibility or probability of capacitive coupling of the source-drain to the punchthrough control implant.

The invention in its broader aspects however is an operative trench gate transistor. This is realized by incorporating guard regions along two opposite sidewalls of the trench. These sidewall guards prevent surface or near surface inversion and confine the effective channel to beneath the trench.

DETAILED DESCRIPTION

Figure 1:
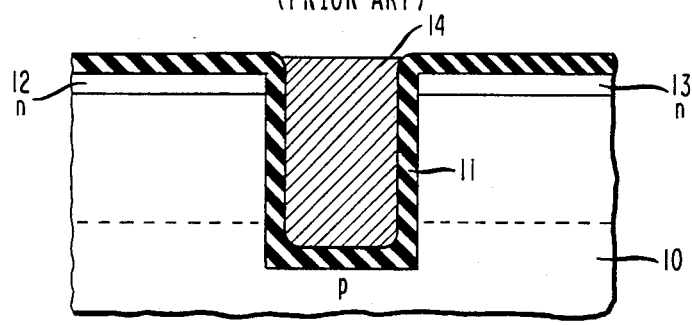
FIGS. 1 and 1A are schematic representations of a structure intended to avoid punchthrough effects by the technique of using a deep trench gate structure.
Figure 1A:
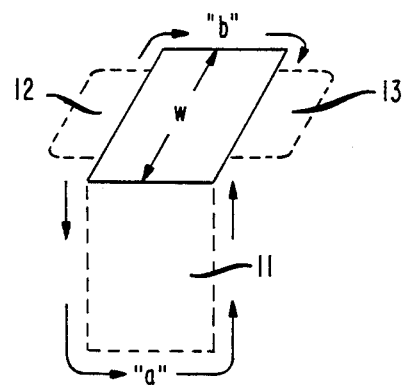

The basic trench gate structure will be described in conjunction with FIGS. 1 and 1A. FIG. 1 is a sectional view through a section of a trench gate showing substrate 10, gate dielectric 11, trench gate 12, source 12 and drain 13. The trench is shown with sufficient depth to avoid overlap of the source and drain depletion regions and thus the structure is designed from that standpoint to effectively combat punchthrough. This view of a trench gate structure is similar to that shown by Iwai in the patent referenced above. The structure has a fatal flaw, and that flaw can be understood when the other dimensions of the structure are seen. Thus, as seen in FIG. 1A, when gate 11 is turned on, conduction between source and drain 12 and 13 occurs, not along path "a" as described by Iwai, but along path "b". Thus the depth of the trench does not control the channel length as claimed by Iwai and punchthrough around the gate (path "b") is not controlled. In principle, one can extend the gate in the "w" dimension in each direction for a distance exceeding the trench depth, while keeping the source and drain width the same, to encourage conduction around the bottom of the trench. However, to do that defeats the object of the trench gate, i.e. small gate surface area and increased device packing density.

I describe here two versions of a trench gate device that does conduct beneath the trench. These versions are exemplary of a category of devices having sidewall guards to prevent the sidewalls from inverting when the gate is biased on. One version uses a thick dielectric layer to increase the sidewall threshold for inversion. The other uses selective doping for increasing the sidewall threshold.

Figure 2:
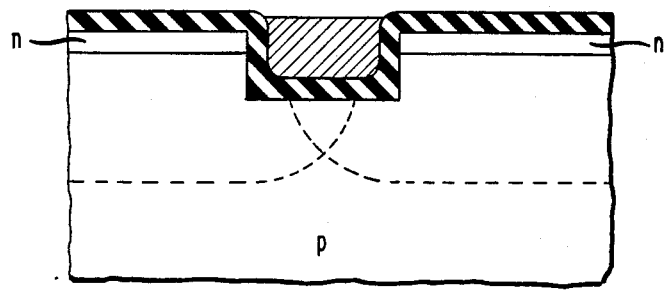
FIG. 2 is a schematic representation of the consequences of a shallow trench gate structure.
Figure 2A:
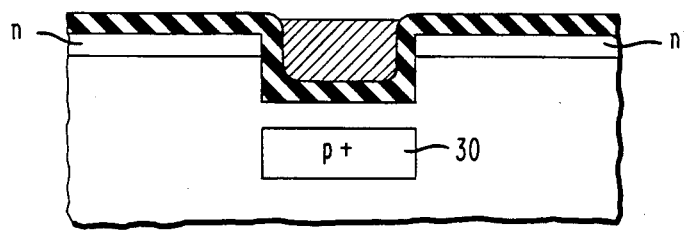
FIG. 2A is a schematic representation of a shallow trench structure with punchthrough control according to the invention.

Another aspect of the invention, as indicated earlier, is gate punchthrough control beneath an operative trench gate. Control of punchthrough is inherent in a properly designed trench gate device if, as in FIG. 1, the trench is made sufficiently deep. However, additional design freedom can be gained using this aspect of the invention that allows the gate to be made shallow, thus increasing device speed, and gaining other potential advantages e.g. device yield. A shallow trench gate without threshold control is shown in FIG. 2 where the occurrence of punchthrough is evident. That is controlled, according to this aspect of the invention, by the punchthrough control implant, seen at 30 in FIG. 2A.

Figure 3:
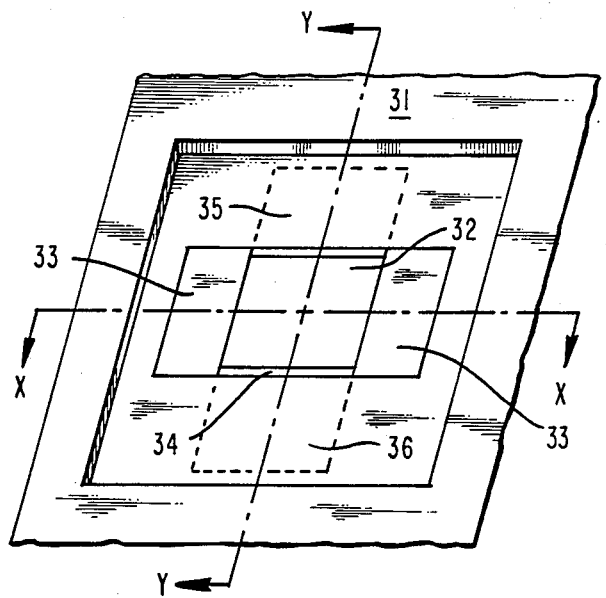
FIG. 3 is a schematic perspective view of an exemplary device according to the invention.

Devices designed with the features of the invention can be fabricated by a variety of techniques. A basic structure is shown in FIG. 3 where 31 is the field oxide, 32 is a trench gate, 33 are sidewall guards for sidewall threshold control, 34 is the gate dielectric and 35 and 36 are the source and drain. Fabrication of this device will be described in conjunction with FIGS. 4A to 4W. It is important to view this sequence from all dimensions. Thus some views will be through section x-x as indicated in FIG. 3 and some views will be through section y—y.

Figure 4A:
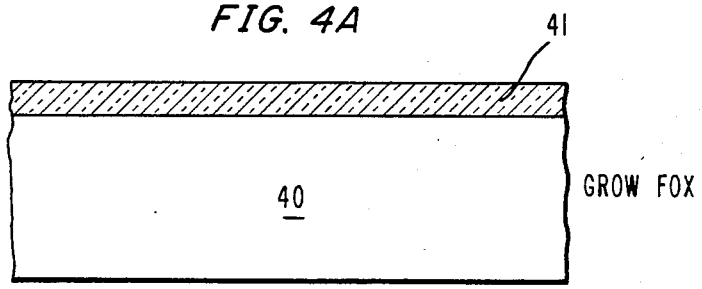
FIGS. 4A to 4U are schematic representations of one exemplary sequence of processing steps for fabricating the device shown in FIG. 3.
Figure 4B:
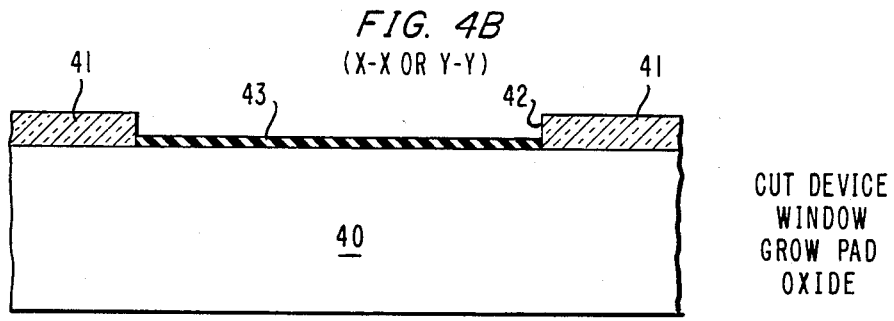
Figure 4C:
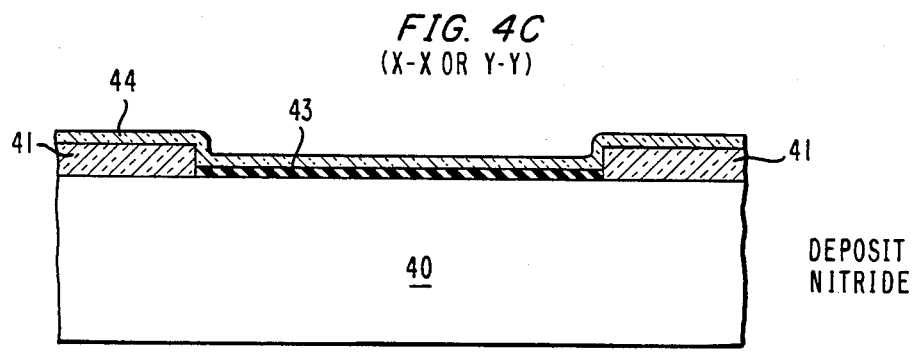
Figure 4D:
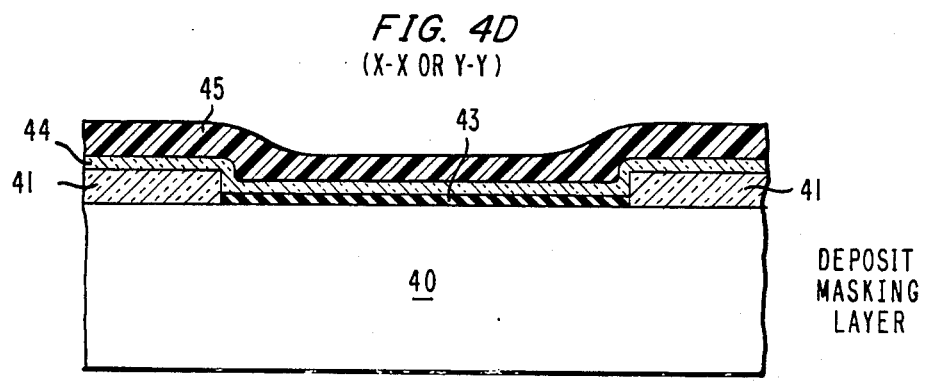
Figure 4H:
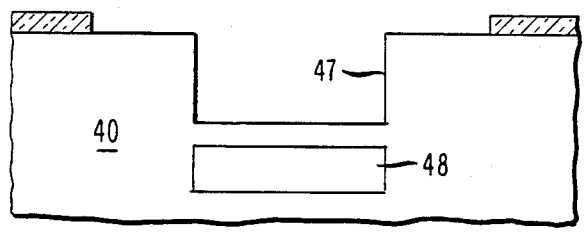
Figure 4J:
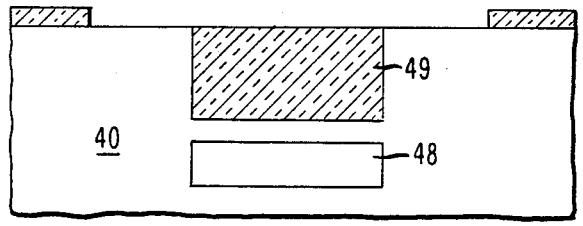
Figure 4K:
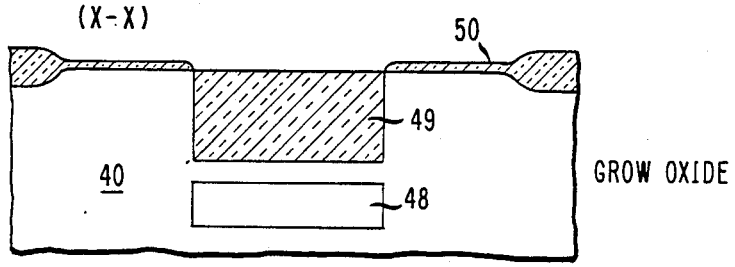
Figure 4L:
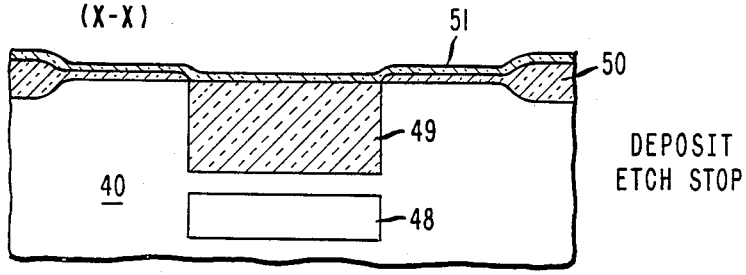
Figure 4R:
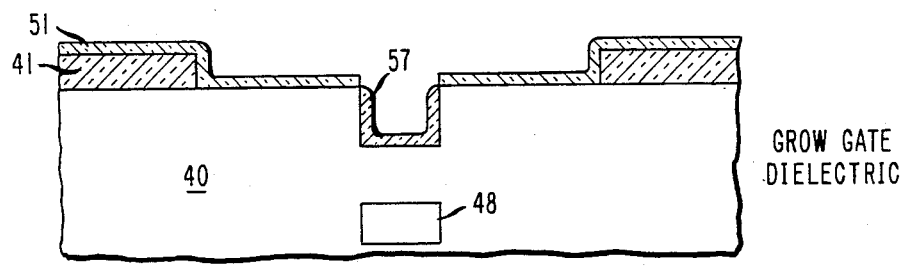
Figure 4S:
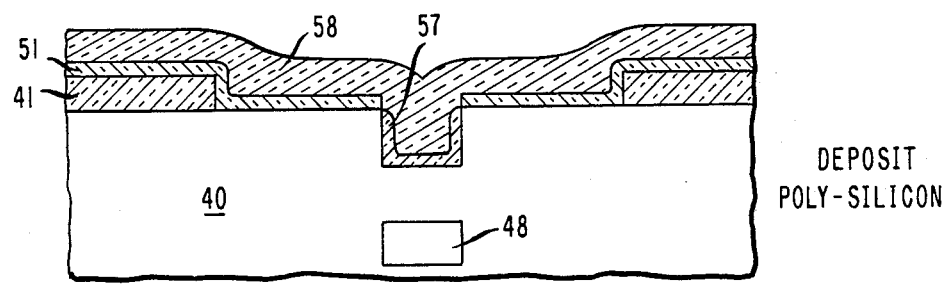
Figure 4T:
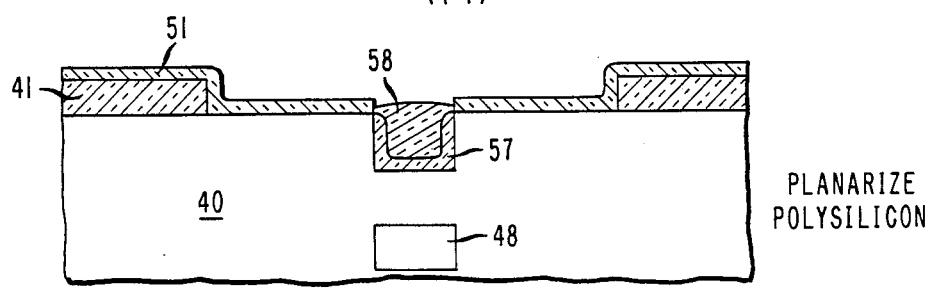
Figure 4U:
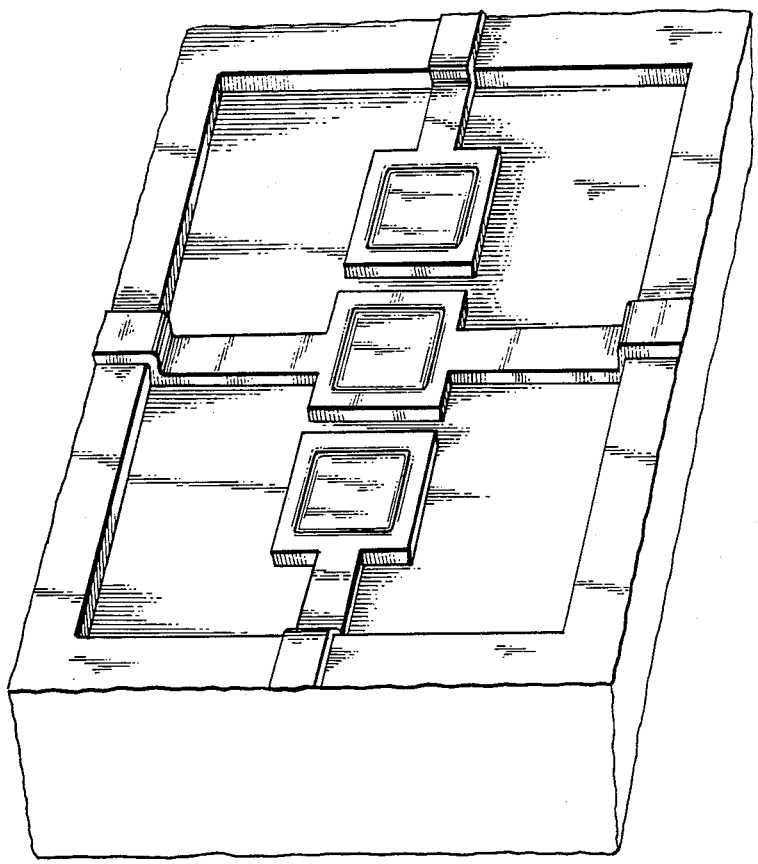

A typical embodiment for forming a buried gate structure is shown in FIGS. 4A to 4U. With reference to FIG. 4A there is shown substrate 40 and overlying field oxide 41. Substrate 40 may be a standard wafer or may include an epitaxial structure. The field oxide for densely packed VLSI is relatively thin, e.g. 0.2 to 1.5 $\mu$ms, preferably 0.2 to 0.5 $\mu$m. Next the GASAD (gate and source and drain) opening 42 is cut as shown in FIG. 4B by masking layer 41 by conventional techniques and etching through layer 41 preferably by an anisotropic technique. Alternatively, conventional isoplanar techniques may be used to form the field oxide. An etch stop layer 43 and 44, the purpose of which will become apparent, is formed over the resulting structure. This layer, which is convenient but optional, preferably comprises a thin pad oxide 43 (FIG. 4B), and an effective etch stop material 44 such as silicon nitride (FIG. 4C). The pad oxide may be a few hundred angstroms and the nitride layer a thickness of the order of 0.03 to 0.3 $\mu$ms. Over the etch stop is deposited a masking layer 45 for the trench etch as shown in FIG. 4D. This mask may be a conventional photoresist etch mask but, due to the severity of the trench etch, a more robust mask, such as silicon dioxide, is recommended. Layer 45 is typically thick, depending upon the selectivity of the trench etch used. A thickness of the order of 0.3 to 0.8 $\mu$ms is useful in this example. A window 46, FIG. 4E, is formed in the mask layer to facilitate the trench etch. The window is formed by conventional masking and etching. Again an anisotropic etch is preferred. The window is formed through the pad oxide and the nitride layer 44 as well. The trench etch is then performed by an anisotropic dry etch technique to form trench 47 as shown in FIG. 4F. Depth of the trench is a matter of design choice and here is approximately 1 $\mu$m. While it is possible to etch deep trenches, with high aspect ratios, the gate lengths that result from deep trenches may be excessive. Accordingly, optimum trench structures are expected to have modest depths, of the order of 0.3 to 3.0 $\mu$m. In designing the transistor the gate length is related to the width of the trench as well as the depth.

Since a primary inspiration for using trench gates is to shrink the surface dimensions of the device, the trench length is typically of the order of the minimum line width of the technology being used. Trench devices may therefore be used with surface widths and lengths of the order of 1.5 $\mu$m or less. The gate (channel) length for a trench structure having a depth of only 1.0$\mu$ is 3$\mu$, less the source-drain depth. Those junctions in state of the art devices will be of the order of 0.5$\mu$, so the total channel length will be approximately 2.0$\mu$m. This length is relatively large, so the design direction will evidently be toward shallower trenches. That direction reduces the effectiveness of the trench in preventing punchthrough and highlights the need for the present invention.

While the trench dimension in the y—y dimension (FIG. 3), the gate length, may be chosen to be a minimum, the dimension in the x—x dimension may be larger to accommodate the processing sequence to be described, i.e., to accommodate the sidewall guards shown in FIG. 3. Other kinds of sidewall guards may be used instead, some of which will be mentioned later, that require little or no additional space in which case the x—x trench dimension may be a minimum as well as the y—y dimension. The x—x dimension may also be extended, and the source and drain widths extended, to increase the width to length ratio and the corresponding gain of the transistor. In logic circuits this ratio may be of the order of 10 or more.

The punchthrough control implant 48 is made into the trench with the mask layer still in place as shown in FIG. 4G. This implant is typically performed at relatively high energy since it is useful to form this implant region below the surface of the channel region. In the example shown here the transistor will be n-channel so the punchthrough control implant will typically be boron. A typical doping level for the substrate is $10^{15}/cm^2$ and a typical level for implant 48 is in the range of $10^{16}$ to $10^{19}/cm^2$. The energy of the implant can be of the order of 90kev or above, or whatever is suitable for reaching the desired implant depth.

At this point a threshold adjusting implant may be performed. An aspect of this invention is the use of such an implant into the bottom of the trench. While the aforementioned patent suggests a threshold adjusting implant into the bottom and or sides of the trench, how that is achieved is not apparent. An implant beam will not reliably dope the sidewalls of the trench, and implanting into the bottom of the trench will only work under carefully controlled circumstances. Thus to achieve effective threshold implants the following prescription should be followed. The resistivity of the substrate initially should be adjusted to a value to permit adjustment of the threshold upward, and the implant species for the adjustment should be the same as the substrate. If a threshold lowering adjustment is to be made, another approach, one that effectively dopes the sidewalls, must be used. Doping from the vapor phase effectively achieves sidewall doping but does not give the necessary control over the final resistivity level. That control is important in the vicinity of the source drain junctions.

In the example given here, with the trench formed and the mask in place, i.e. at the stage of FIG. 4F or 4G, a boron implant is optionally performed to adjust the gate threshold. The implant may be for example a dose to provide $10^{16}/cm^2$ at an energy of, for example, 30kev to 100 kev. It may also be convenient to combine this implant step with the punchthrough control implant.

The implant steps, which form the basis for one aspect of the invention, can also be formed later in the processing sequence, i.e. at step 4Q when the gate trench is formed.

The etched trench shown at 47 in FIG. 4F, with mask 45 in place is preferably centered in the GASAD window but some offset, shown in phantom 47', is tolerable as long as adequate space remains for a source-drain. At this stage of the process oxide mask layer 45 may be removed, e.g. by conventional, preferably RIE, techniques. The function of the etch stop layer 44 now becomes evident. It is convenient to preserve field oxide layer 41 which would, but for layer 44, be removed during etching of oxide mask 45. Other alternatives are available, i.e. using a nitride mask rather than an oxide mask and relying on the selectivity between nitride-oxide etch rates. In the embodiment described here the nitride etch stop layer 44 may now be removed if desired. It is beneficial to avoid exposure of the bare silicon substrate to an RIE atmosphere. Accordingly, the pad oxide 43 is preferably formed beneath the nitride layer as described earlier. A temporary or sacrificial oxide may be formed in the trench to prevent undesired etching of the trench during removal of the nitride layer. The temporary oxide, and the pad oxide can be removed if desired using buffered HF etch.

Turning now to the x—x view, FIG. 4H shows this section with trench 47 as shown, and the mask layer removed. A dielectric filler layer 49 is deposited to fill the trench 47 (FIG. 4J). This layer may be formed by depositing material such as silicon dioxide to a thickness of the order of twice the trench width, and planarizing the layer by known RIE techniques down to the surface of the substrate 40. The result is shown in FIG. 4J. A silicon dioxide layer 50 is then grown on the exposed substrate portions as shown in FIG. 4K and an etch stop layer 51 deposited thereover in a fashion similar to that described in connection with FIG. 4C producing the structure shown in FIG. 4L. A mask layer 52 is formed as in FIG. 4M and patterned as in FIG. 4N with window 53 corresponding to the gate outline. This trench is centered approximately within the lateral boundaries of the oxide filler 49. The mask opening also extends beyond the boundaries of the filler layer 49 in the y—y dimension as shown in FIG. 4P. The source and drain implants 54 and 55 may be made at this point as shown in FIG. 4P. Those regions are then capped with oxide and gate trench 56 formed as shown in FIG. 4Q. The gate structure is then formed as seen best in the y—y section of FIG. 4R. The structure of FIG. 4R has the thick oxide mask layer 52 removed, using etch stop layer 51. Then gate oxide 57 is grown as shown. This layer is typically thin, of the order of 0.02 to 0.1 μm. If desired, dual dielectrics, e.g. silicon dioxide and silicon nitride may be used.

Next, a thick layer 58 of polysilicon is deposited into the gate trench as shown in FIG. 4S. Polysilicon is preferred for this filling material because of its thermomechanical match with the substrate. However, other conductive materials may be used if desired. The thickness of layer 58 is chosen to fill the trench. The polysilicon may then be planarized as in FIG. 4T. The nitride layer may be removed at this point. Source/drain formation was described earlier but alternatively may be performed at this stage of the sequence. A passivating layer of silicon dioxide or p-glass may then be deposited over the structure. Contact windows to source gate and drain are formed in a conventional way. Schematically, a finished structure is shown in the perspective view of FIG. 4U.

An alternative approach to forming sidewall guards is to heavily dope the sidewalls selectively with an impurity the prevents sidewall inversion. For an n-channel device, the sidewalls would be doped p-type, e.g. with boron. Techniques for selectively doping opposite sidewalls of a trench structure will occur to those skilled in the art. Examples of such techniques are described in detail in copending application Ser. No. 675,305 filed Nov. 27, 1984 by L. T. Lancaster, Case 2. Those techniques are lengthy and are omitted here for simplicity but are incorporated by reference in support of the teachings set forth in this specification.

Although this description is mainly in terms of a transistor with doped source and drain regions, a one transistor memory cell may be made using a trench gate in which case the drain would more typically have a capacitor associated with it. There have been several proposals for building memory cells with trench capacitors and the marriage of those devices with trench gate structures as described here would be expected.

Among the several advantages of trench gate transistors, a particularly significant one is the flat topography that results from burying the gate into the substrate. It may be expected that a variety of new integrated structures will be developed using this basic transistor structure. For example, an attractive possibility is to form a second transistor over the top of a buried gate transistor. The two transistors could be designed to share the buried gate.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. Device comprising:
    a source region of an MOS transistor formed in a semiconductor substrate,
    a drain region of an MOS transistor formed in the substrate,
    and a trench gate structure separating the source and drain
    said trench gate structure comprising a groove formed in the substrate the groove having substantially vertical first and second opposing pairs of sidewalls,
    a dielectric layer covering the bottom and said first pair of substantially vertical sidewalls,
    a pair of sidewall guards on said second pair of sidewalls,
    a gate electrode covering the dielectric layer,
    electrical contact means contacting the source, drain and gate,
    and an implant region formed into the bottom of the trench and having a resistivity less than that of surrounding substrate material.

2. Device of claim 1 in which the implant region is formed substantially below the bottom of the trench.

3. Device of claim 1 in which the implant region is formed at and near the surface of the trench bottom.

4. A trench gate transistor comprising;
    source and drain regions formed into the surface of a semiconductor substrate, a trench gate separating the source and drain regions, said trench gate comprising a trench having first and second pairs of opposing sidewalls, said sidewalls being substantially vertical with respect to the substrate, the first pair of opposing sidewalls being in contact with the source and drain regions and the second pair of sidewalls extending approximately between the source and drain regions, a dielectric layer covering at least portions the first pair of sidewalls, a gate electrode covering at least portions of the dielectric layer, and a pair of sidewall guards on said second pair of sidewalls adapted to prevent inversion of the sidewalls when the trench gate is turned on.

5. The device of claim 4 in which the sidewall guards on the second pair of sidewalls comprise a dielectric layer with a thickness substantially greater than that on the first pair of sidewalls.

6. The device of claim 4 in which the sidewall guards comprise doped regions with a doping level substantially greater than the doping along the first pair of sidewalls.

* * * * *